(12) United States Patent
Sasaki et al.

(10) Patent No.: US 7,547,619 B2
(45) Date of Patent: Jun. 16, 2009

(54) METHOD OF INTRODUCING IMPURITY, DEVICE AND ELEMENT

(75) Inventors: Yuichiro Sasaki, Machida (JP); Bunji Mizuno, Ikoma (JP); Ichiro Nakayama, Kadoma (JP)

(73) Assignee: Panasonic Corporation, Osaka (JP)

( * ) Notice: Subject to any disclaimer, the term of this patent is extended or adjusted under 35 U.S.C. 154(b) by 312 days.

(21) Appl. No.: 10/526,999

(22) PCT Filed: Sep. 19, 2003

(86) PCT No.: PCT/JP03/12001

§ 371 (c)(1),
(2), (4) Date: Mar. 7, 2005

(87) PCT Pub. No.: WO2004/027847

PCT Pub. Date: Apr. 1, 2004

(65) Prior Publication Data

US 2006/0088989 A1    Apr. 27, 2006

(30) Foreign Application Priority Data

Sep. 20, 2002  (JP) ............................. 2002-274554

(51) Int. Cl.
  *H01L 21/42* (2006.01)
  *H01L 21/26* (2006.01)
(52) U.S. Cl. ............................. 438/535; 257/E21.135; 257/E21.143
(58) Field of Classification Search ................. 438/535; 257/E21.135, E21.143
See application file for complete search history.

(56) References Cited

U.S. PATENT DOCUMENTS 5,387,545 A    2/1995    Kiyota et al.

(Continued)

FOREIGN PATENT DOCUMENTS

EP    0 430 168 A2    6/1991

(Continued)

OTHER PUBLICATIONS

Japanese Search Report for PCT/JP03/12001, dated Nov. 17, 2004.

(Continued)

*Primary Examiner*—Asok K Sarkar
(74) *Attorney, Agent, or Firm*—RatnerPrestia

(57) ABSTRACT

A method of introducing an impurity and an apparatus for introducing the impurity forms an impurity layer easily in a shallower profile. Component devices manufactured taking advantage of these method or apparatus are also disclosed. When introducing a material to a solid substance which has an oxidized film or other film sticking at the surface, the present method and apparatus first removes the oxidized film and other film using at least one means selected from among the group consisting of a means for irradiating the surface of solid substance with plasma, a means for irradiating the surface of solid substance with gas and a means for dipping the surface of solid substance in a reductive liquid; and then, attaches or introduces a certain desired particle. The way of attaching, or introducing, a particle is bringing a particle-containing gas to make contact to the surface, which surface has been made to be free of the oxidized film and other film. Thus, the particle is attached or introduced to the surface, or the vicinity, of solid substance. The component devices are those manufactured taking advantage of the above method or apparatus.

12 Claims, 3 Drawing Sheets

U.S. PATENT DOCUMENTS 5,851,906 A 12/1998 Mizuno et al.
6,324,715 B1 * 12/2001 Hymes et al. .................. 15/77

FOREIGN PATENT DOCUMENTS

| JP | 03-173420 | | 7/1991 |
|----|-----------|---|--------|
| JP | 04-219927 | | 8/1992 |
| JP | 07094427 | * | 4/1995 |
| JP | 08031779 | * | 2/1996 |
| JP | 08-172214 A | | 7/1996 |
| JP | 09-007962 A | | 1/1997 |
| JP | 09-115844 | | 5/1997 |
| JP | 09-283456 A | | 10/1997 |
| JP | 10-135244 A | | 5/1998 |
| JP | 11-204450 A | | 7/1999 |
| JP | 2000-164523 | | 6/2000 |

OTHER PUBLICATIONS

D. Lenoble, et al., "Reliable and enhanced performances of sub-0.1 $\mu m_p$MOSFETs doped by low biased Plasma Doping", 2000 Symposium on VLSI Technology Digest of Technical Papers, pp. 110-111.

Yukihiro Kiyota, "Surface Reaction Doping using Gas Source for Ultra Shallow Junctions", Japan Society of Applied Physics, pp. 19 through 22.

Yukihiro Kiyota, et al., "Role of hydrogen during rapid vapor-phase doping analyzed by x-ray photoelectron spectroscopy and Fourier-transform infrared-attenuated total reflection", pp. 1-5, J. Vac. Sci. Technol. A 16(1) Jan./Feb. 1998, American Vacuum Society.

* cited by examiner

METHOD OF INTRODUCING IMPURITY, DEVICE AND ELEMENT

THIS APPLICATION IS A U.S. NATIONAL PHASE APPLICATION OF PCT INTERNATIONAL APPLICATION PCT/JP2003/012001.

TECHNICAL FIELD

The present invention relates to a method and an apparatus used for introducing the impurity in the course of manufacturing semiconductor devices, etc. The present invention also relates to those devices manufactured in accordance with the method using the apparatus.

BACKGROUND ART

Solid substances are generally covered at the surface with an oxide film formed as the result of coupling between the atoms constituting solid substance and the oxygen in the atmospheric air. The introduction of impurity material to a solid substance has been conducted using an ion implantation or the like physical procedures, from above the oxide film which is kept on the surface as it is. Namely, irradiating the surface of a solid substance with ion of impurity source energized with electric fields, etc., thereby introducing the impurity into the inside.

As the result of recent development of finer device technologies in the device sector, it is requested to form a junction in a shallower profile. The low-energy ion implantation is a conventional technology used for forming a shallow junction. A number of improvements have been introduced to the low-energy ion implantation technology; for example, pulling ion out of the source using a substantially high voltage and then reducing the speed at a later stage. In this way, a low-energy implantation is realized while keeping the beam current value at a substantially high level. Such technologies have been successful in providing impurity layers in a profile as shallow as several 10 nm; and the layers have been in practical use in the semiconductor device industry.

Plasma doping technology is attracting the attention as a new technology for forming the junction in a still shallower profile. In the plasma doping process, plasma containing a certain desired particle is made to have contact with the surface of a target semiconductor substrate; thereby, the certain desired particle is introduced to the surface. Since the energy of plasma is as low as several hundreds volts at the highest, it is a suitable vehicle for forming an impurity layer in a shallow profile. According to experimental reports, the shallow junctions of ten-odd nm to several 10s nm deep have been formed. The Technical Digest of Symposium on VLSI Technology, Honolulu, p 110, (2000), discloses an experimental result; according to which, depth of a P-type junction is the smallest ever, or 7 nm.

Gaseous phase doping method which uses a gas source is also proposed in the IWJT, p. 19, (2000), the Japan Vacuum. Science Technology, A16, p 1, (1998), the Silicon Technology, No. 39, 18th Jun. 2002, and other publications. According to the method, a semiconductor substrate is heated in the normal pressure atmosphere of hydrogen, and $B_2H_6$, $PH_3$ are supplied thereto for providing impurity diffusion layers, P-type and N-type. The hydrogen carrier gas is effective for removing the natural oxidation film sticking on the silicon surface, and for keeping the surface clean. So, it is advantageous in suppressing a surface segregation of the impurity, a.o. boron. For decomposing the gas, it requires a high temperature, generally higher than 600° C. The Silicon Technology, No. 39, 18 Jun. 2002, for example, reports an experimental result of forming a high-concentration shallow junction, in which a semiconductor substrate is heated to 900° C. and a 1 ppm $B_2H_6$ gas is delivered. Defining a level of boron concentration $1\times10^{18}/cm^3$ as the junction depth, depth of a junction attained in the above experiment is approximately the same as that reported in the earlier-described technology, 7 nm.

The above-described plasma doping and the low-energy ion implantation are the new technologies proposed to meeting the needs of a shallower junction, which needs have arisen as the result of efforts to implement finer device technologies. According to the recent publications, shallow junctions of ten-odd nm to several 10s nm deep have already been realized on experimental basis. The shallowest ever P-type junction is 7 nm, as already described in the above. In the face of continuous developments towards finer processing technologies, the needs of a new technology that can form an impurity layer through an easy process in a still shallower profile are growing. The plasma doping is a process for implanting the particles having acceleration energy into a semiconductor substrate, although the energy is small. So, it seems to be difficult for the plasma process to form an impurity layer in a still shallower profile. The gaseous phase doping which uses a gaseous source is a technology for forming an impurity layer taking advantage of the surface reaction by supplying a dopant having no acceleration energy to the substrate. This technology appears to be promising as a breakthrough to the limit in the conventional technologies which irradiate the substrate with energized ion. However, as described earlier, the technology requires a high temperature, higher than 600° C., for decomposing the gas. The high temperature makes it impossible to use a photo resist for the mask material. As the result, it becomes necessary to form a $CVD-SiO_2$, etc., or to provide a patterning; which leads to an increase in the process steps for forming transistors.

DISCLOSURE OF THE INVENTION

In the course of introducing a certain impurity material to a solid substance which has an oxidation film or other film, etc. sticking at the surface, a method in accordance with the present invention first removes the oxidation film and other film with at least one means selected from among the group consisting of a means to irradiate the surface of solid substance with plasma, a means to irradiate the surface of solid substance with gas and a means to dip the surface of solid substance in a reductive liquid; and then, attaches or introduces a certain desired particle to the surface.

In the course of introducing a certain impurity material to a solid substance which has an oxidation film or other film, etc. sticking at the surface, an apparatus for introducing the impurity in accordance with the present invention first removes the oxidation film and other film with at least one means selected from among the group consisting of a means to irradiate the surface of solid substance with plasma, a means to irradiate the surface of solid substance with gas and a means to dip the surface of solid substance in a reductive liquid; and then, attaches or introduces a certain desired particle to the surface.

Impurity-containing component devices in accordance with the present invention are those manufactured through a procedure in which, in the course of introducing a certain material to a solid substance which has an oxidation film or other film, etc. sticking at the surface, the oxidation film and other film are first removed with at least one means selected from among the group consisting of a means to irradiate the surface of solid substance with plasma, a means to irradiate the surface of solid substance with gas and a means to dip the surface of solid substance in a reductive liquid; and then, a certain desired particle is attached or introduced to the surface.

DETAILED DESCRIPTION OF THE PREFERRED EMBODIMENTS

Figure 1:
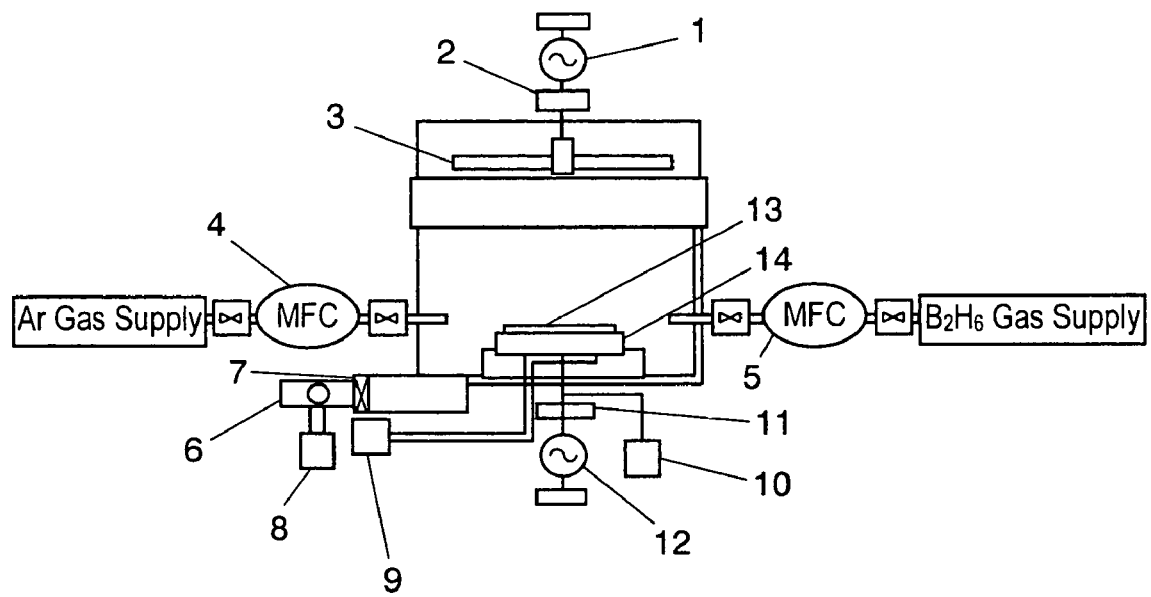
FIG. 1 is a cross sectional view showing the key portion of a process chamber.

In the course of introducing a certain material to a solid substance which has an oxidation film or other film, etc. sticking at the surface, a method of introducing the impurity and an apparatus for introducing the impurity in accordance with the present invention first remove the oxidation film and other film using at least one means selected from among the group consisting of a means to irradiate the surface of solid substance with plasma, a means to irradiate the surface of solid substance with gas and a means to dip the surface of solid substance in a reductive liquid; and then, attaches or introduces a certain desired particle to the surface.

The removal of the surface film facilitates easier sticking of the particle, and an impurity layer can be formed at the vicinity of the surface. Plasma of argon or that of a hydrogen system, etc. is used for irradiating the surface of solid substance. In the case where a gas is used, gas of a hydrogen system is used. The reductive liquid is at least the one item which is selected from among the group consisting of hydrogen fluoride, sodium hydroxide, aqueous ammonia, sulfinic acid and adipic acid di-2-ethylhexyl ester. In the means for dipping the surface of solid substance in a reductive liquid, it is preferred that the surface is rubbed mechanically when it is dipped in a reductive liquid. This is because the mechanical rubbing facilitates easier removal of the surface film.

One of the methods of attaching or introducing a certain desired particle is bringing a gas containing the desired particle to the surface of solid substance, which surface has been made to be free of the oxidation film and other film, to have the particle attached or introduced to the surface, or the vicinity, of solid substance. Other method of attaching or introducing a certain desired particle is; irradiating the surface of solid substance, which surface has been made to be free of the oxidized film and other film, with electromagnetic wave whose energy is stronger than that which is binding the hydrogen or hydroxyl radical sticking at the surface with the atom of solid substance, thereby converting the binding into a non-coupled state to have the sticking hydrogen or hydroxyl radical separated, exposing the atom constituting the solid substance to the surface, and then irradiating the surface with a certain desired particle in order to have it attached or introduced to the surface, or the vicinity, of solid substance. At the surface of solid substance whose oxidized film and other film have already been removed, there is hydrogen or hydroxyl radical, having substantially uniform binding energy, bound with the atom of solid substance. The state of their binding can be easily broken by delivering an energy that is stronger than the binding energy. Since the energy of electromagnetic waves is easy to control, the above-described irradiation procedure can be performed with high reproducibility. Namely, it is easy to select an optimum electromagnetic wave, whose energy is strong enough to break the binding at the same time it does not ill-affect the solid substance's surface conditions, and to irradiate it with a good reproducibility. The solid substance's atom thus exposed to the surface is in an activated state; which means that it is readily bound with other particles. Therefore, it is easy to have an impurity attached or introduced on the surface, or the vicinity, of solid substance, by irradiating a certain desired particle after the constituent atom has been activated. The certain desired particle should preferably be making access to the constituent atom at a low velocity, viz. with a low energy. This is because the low-energy particle can be easily trapped by the activated atom. The low-energy particle signifies that in the state of plasma, gas or ultra low-energy ion. The gas containing a certain desired particle does not need to be heated to a high temperature for decomposition; the temperature of solid substance may be lower than 600° C., furthermore, impurity can be introduced even in the normal room temperature.

The energy of electromagnetic wave irradiated in the present impurity introducing method corresponds to 318 kJ/mol or higher, lower than 666 kJ/mol.

More preferably, the energy should be higher than 425 kJ/mol, lower than 666 kJ/mol. The reason for that is that: the typical value of binding energy with the oxygen atom at the surface of solid substance is 452 kJ/mol, and it is desired to irradiate an electromagnetic wave whose energy is sufficient for removing the oxygen.

As already described, in a method of introducing the impurity in accordance with the present invention, the process of attaching or introducing a certain desired particle is conducted in an environment where the solid substance's temperature is lower than 600° C.

In a method of introducing the impurity in accordance with the present invention, in the course of introducing a material in the phase of ion, plasma, gas, etc. to a solid substance having an oxidized film or other film, etc. sticking at the surface, the oxidized film and other film are first removed as the surface treatment to solid substance using at least one means selected from among the group consisting of a means to irradiate the surface of solid substance with plasma, a means to irradiate the surface of solid substance with gas and a means to dip the surface of solid substance in a reductive liquid; and then, a certain desired particle is attached or introduced.

A certain desired particle in the present impurity introducing method is attached or introduced from either one of the states among plasma, gas and ultra low-energy ion.

An impurity introducing method in accordance with the present invention uses at least one item selected from among each of the following respective categories; at least one apparatus selected from among the group consisting of an apparatus for irradiating the surface of solid substance with plasma, an apparatus for irradiating the surface of solid substance with gas and an apparatus for dipping the surface of solid substance in a reductive liquid; an apparatus for bringing a gas containing a certain desired particle to make contact with the surface of solid substance; and an annealing apparatus for diffusing the certain desired particle attached or introduced therein.

An apparatus for dipping the surface of solid substance in a reductive liquid used in the present impurity introducing method is provided with a mechanism for rubbing the surface of solid substance mechanically.

An apparatus for bringing a gas containing a certain desired particle to make contact with the surface of solid substance used in the present impurity introducing method is provided with a facility which is capable of irradiating electromagnetic wave whose energy is stronger than the energy that is binding the hydrogen or hydroxyl radical sticking on the surface of solid substance, which surface has been made to be free of the oxidized film and other film, with the atom of solid substance.

An impurity introducing method in accordance with the present invention uses, in a combination mode or as an integration, at least two items selected from among the following categories; at least one apparatus selected from among the group consisting of an apparatus for irradiating the surface of solid substance with plasma, an apparatus for irradiating the surface of solid substance with gas and an apparatus for dipping the surface of solid substance in a reductive liquid; an apparatus for bringing a gas containing a certain desired particle to make contact with the surface of solid substance; and an annealing apparatus for diffusing the certain desired particle attached or introduced therein.

Active component devices such as a semiconductor device, an LCD, a bio-chip, etc. and passive component devices such as a resistor, a coil, a capacitor, etc. in the present invention are those manufactured by taking advantage of the above-described method of introducing the impurity.

In an impurity introducing apparatus in accordance with the present invention, in the course of introducing a material to a solid substance which has an oxidized film or other film, etc. sticking at the surface, the oxidized film and other film are first removed as the surface treatment to the solid substance using at least one means selected from among the group consisting of a means to irradiate the surface of solid substance with plasma, a means to irradiate the surface of solid substance with gas and a means to dip the surface of solid substance in a reductive liquid; and then, a certain desired particle is attached or introduced.

The plasma used in the present impurity introducing apparatus is that of rare gas argon or a system containing hydrogen.

The gas used in the present impurity introducing apparatus is a gas of a system containing hydrogen.

The reductive liquid used in the present impurity introducing apparatus is at least one item selected from among the group consisting of hydrogen fluoride, sodium hydroxide, aqueous ammonia, sulfinic acid and adipic acid di-2-ethylhexyl ester.

A means for dipping the surface of solid substance in a reductive liquid used in the present impurity introducing apparatus rubs the surface mechanically when it is dipped in the reductive liquid.

A method of attaching or introducing a certain desired particle used in the present impurity introducing apparatus is bringing a gas containing a certain desired particle to make contact with the surface of solid substance, which surface has been made to be free of oxidized film and other film, thereby attaching or introducing the particle to, or the vicinity, of the surface.

A method of attaching or introducing a certain desired particle used in the present impurity introducing apparatus is irradiating the surface of solid substance, which surface has been made to be free of oxidized film and other film with electromagnetic wave whose energy is stronger than the energy that is binding the hydrogen or hydroxyl radical at the surface with the atom of solid substance, thereby converting the binding into a non-coupling state to have the sticking hydrogen or hydroxyl radical separated, and the atom constituting the solid substance exposed to the surface, and then bringing the certain desired particle to make contact with the surface. Thus the particle is attached or introduced to the surface, or the vicinity, of solid substance.

The energy of electromagnetic wave irradiated in the present impurity introducing apparatus corresponds to 318 kJ/mol or higher, lower than 666 kJ/mol.

More preferably; the energy should be higher than 425 kJ/mol, lower than 666 kJ/mol. The reason for that is that: the typical value of binding energy with oxygen atom at the surface of solid substance is 452 kJ/mol, and it is desired to irradiate an electromagnetic wave that is sufficient for removing the oxygen.

A method of attaching or introducing a certain desired particle used in the present impurity introducing apparatus is performed in an environment where the solid substance's temperature is lower than 600° C.

In an apparatus for introducing the impurity in accordance with the present invention, in the course of introducing a material in the phase of ion, plasma, gas, etc. to a solid substance having an oxidized film or other film, etc. sticking at the surface, the oxidized film and other film are first removed as the surface treatment using at least one means selected from among the group consisting of a means to irradiate the surface of solid substance with plasma, a means to irradiate the surface of solid substance with gas and a means to dip the surface of solid substance in a reductive liquid; and then, a certain desired particle is attached or introduced.

A certain desired particle in the present impurity introducing apparatus is attached or introduced from either one of the states among plasma, gas and ultra low-energy ion.

An apparatus for introducing the impurity in accordance with the present invention is provided with at least one item selected from among each of the following respective categories; at least one apparatus selected from among the group consisting of an apparatus for irradiating the surface of solid substance with plasma, an apparatus for irradiating the surface of solid substance with gas and an apparatus for dipping the surface of solid substance in a reductive liquid; an apparatus for bringing a gas containing a certain desired particle to make contact with the surface of solid substance; and an annealing apparatus for diffusing the certain desired particle attached or introduced therein.

An apparatus for dipping the surface of solid substance in a reductive liquid used in the present impurity introducing apparatus is provided with a mechanism for rubbing the surface of solid substance mechanically.

An apparatus for bringing a gas containing a certain desired particle to make contact with the surface of solid substance used in the present impurity introducing apparatus is provided with a facility which is capable of irradiating electromagnetic wave whose energy is stronger than the energy that is binding the hydrogen or hydroxyl radical sticking at the surface of solid substance, which surface has been made to be free of the oxidized film and other film, with the atom of solid substance.

An impurity introducing apparatus in accordance with the present invention uses, in a combination mode or as an integration, at least two items selected from the following categories; at least one apparatus selected from among the group consisting of an apparatus for irradiating the surface of solid substance with plasma, an apparatus for irradiating the surface of solid substance with gas and an apparatus for dipping the surface of solid substance in a reductive liquid; an apparatus for bringing a gas containing a certain desired particle to make contact with the surface of solid substance; and an annealing apparatus for diffusing the certain desired particle attached or introduced therein.

Impurities-containing component devices in the present invention are those manufactured through a procedure, in the course of introducing a material to a solid substance having an oxidized film or other film, etc. sticking on the surface, in which procedure the oxidized film and other film are first removed as the surface treatment using at least one means selected from among the group consisting of a means for irradiating the surface of solid substance with plasma, a means for irradiating the surface of solid substance with gas and a means for dipping the surface of solid substance in a reductive liquid; and then, a certain desired particle is attached or introduced.

The plasma used for manufacturing the impurity-containing component devices in the present invention is that of rare gas argon or a system containing hydrogen.

The gas used for manufacturing the impurity-containing component devices in the present invention is a hydrogen system gas.

The reductive liquid used for manufacturing the impurity-containing component devices in the present invention is at least one items elected from among the group consisting of hydrogen fluoride, sodium hydroxide, aqueous ammonia, sulfinic acid and adipic acid di-2-ethylhexyl ester.

The means for dipping the surface of solid substance in a reductive liquid used for manufacturing impurity-containing component devices in the present invention rubs the surface mechanically when it is dipped in the reductive liquid.

A method of attaching or introducing a certain desired particle used for manufacturing the present impurity-containing component devices brings a gas containing a certain desired particle to make contact to the surface of solid substance, which surface has been made to be free of the oxidized film and other film; thereby, the certain desired particle is attached or introduced to the surface, or the vicinity, of solid substance.

A method of attaching or introducing a certain desired particle used for manufacturing the impurity-containing component devices in the present invention irradiates the surface of a solid substance, which surface has been made to be free of the oxidized film and other film, with electromagnetic wave whose energy is stronger than the energy that is binding the hydrogen or hydroxyl radical at the surface with the atom of solid substance, thereby converting the binding into a non-coupling state to have the sticking hydrogen or hydroxyl radical separated and exposing the atom constituting the solid substance to the surface; and then, delivers a certain desired particle to make contact to the surface in order to have it attached or introduced at the surface, or the vicinity, of solid substance.

The energy of electromagnetic wave irradiated for manufacturing the impurity-containing component devices in the present invention corresponds to 318 kJ/mol or higher, lower than 666 kJ/mol.

More preferably, the energy should be higher than 425 kJ/mol, lower than 666 kJ/mol. The reason for that is that: typical value of the binding energy with the oxygen atom at the surface of solid substance is 452 kJ/mol, and it is desired to apply a sufficient electromagnetic wave for removing the oxygen.

The method of attaching or introducing a certain desired particle used for manufacturing the impurity-containing component devices in accordance with the present invention is performed in an environment where the solid substance's temperature is lower than 600° C.

Impurity-containing component devices in the present invention are manufactured through a procedure, in the course of introducing a material in the phase of ion, plasma, gas, etc. to a solid substance which has an oxidized film or other film, etc. sticking at the surface, in which the oxidized film and other film are first removed as the surface treatment to solid substance using at least one means selected from among the group consisting of a means for irradiating the surface of solid substance with plasma, a means for irradiating the surface of solid substance with gas and a means to dip the surface of solid substance in a reductive liquid; and then, a certain desired particle is attached or introduced.

A certain desired particle used for manufacturing the impurity-containing component devices in the present invention is attached or introduced from either one of the states among plasma, gas and ultra low-energy ion.

Impurity-containing component devices in the present invention are manufactured on a manufacturing facility which includes at least one item selected from among each of the following respective categories; at least one apparatus selected from among the group of an apparatus for irradiating the surface of solid substance with plasma, an apparatus for irradiating the surface of solid substance with gas and an apparatus to dip the surface of solid substance in a reductive liquid; an apparatus for bringing a gas containing a certain desired particle to make contact with the surface of solid substance; and an annealing apparatus for diffusing the certain desired particle attached or introduced therein.

An apparatus of dipping the surface of solid substance in a reductive liquid used for manufacturing impurity-containing component devices in the present invention is provided with a mechanism which rubs the surface of solid substance mechanically.

An apparatus of bringing a gas containing a certain desired particle to make contact with the surface of solid substance used for manufacturing impurity-containing component devices in the present invention is provided with a facility which is capable of irradiating electromagnetic wave having an energy stronger than the energy that is binding the hydrogen or hydroxyl radical at the surface, which surface has been made to be free of the oxidized film and other film, with the atom of solid substance.

Impurity-containing component devices in the present invention are those manufactured on a production facility which includes in a combination mode or as an integration at least two items selected from the following categories; at least one apparatus selected from among the group consisting of an apparatus for irradiating the surface of solid substance with plasma, an apparatus for irradiating the surface of solid substance with gas and an apparatus for dipping the surface of solid substance in a reductive liquid; an apparatus for bringing a gas containing a certain desired particle to make contact with the surface of a solid substance; and an annealing apparatus for diffusing the certain desired particle attached or introduced therein.

Preferred embodiments of the present invention are described below.

Exemplary Embodiment A

An experiment was made using a semiconductor silicon substrate. The main part of the facilities used in the experiment A includes a preliminary vacuum chamber and a process chamber. In the first place, the preliminary vacuum chamber is made open to the normal atmospheric pressure, and then semiconductor substrate 13, or the solid substance, is put on a handling arm in the preliminary vacuum chamber. After the pressure of preliminary vacuum chamber is lowered, the handling arm carries semiconductor substrate 13 to the inside of process chamber. FIG. 1 is a cross sectional view showing the key portion of process chamber. Referring to FIG. 1, a high frequency electric signal generated at high frequency power supply 1 is delivered to coil and antenna 3 via matching box 2. Matching box 2 is for making coordination between high frequency power supply 1 and coil and antenna 3; namely, it coordinates coil and antenna 3's input impedance and high frequency power supply 1's output impedance for producing a good matching between them. By so doing, the high frequency electric signal generated at high frequency power supply 1 is transferred efficiently to coil and antenna 3. High frequency electric signal generated at high frequency power supply 12 is delivered to lower electrode 14 via matching box 11. Matching box 11 is for making coordination between high frequency power supply 12 and lower electrode 14; namely, it coordinates lower electrode 14's input impedance and high frequency power supply 12's output impedance for producing a good matching between them. By so doing, the high frequency electric signal generated at high frequency power supply 12 is transferred efficiently to lower electrode 14. The inflow of diborane ($B_2H_6$) gas coming from a diborane gas supply is controlled by mass flow controller 5 before it is delivered to the inside of the chamber. The inflow of argon (Ar) gas coming from an argon gas supply is controlled by mass flow controller 4 before it is delivered to the inside of the chamber. Turbo-molecular pump 6 and dry pump 8 reduce the pressure within the chamber, while conductance valve 7 controls it to a desired pressure value.

Semiconductor substrate 13 is transferred to the process chamber to be placed on lower electrode 14. After the transportation is finished, the transfer channel is closed to separte the process chamber from the preliminary vacuum chamber. The process chamber is connected with independent gas intake ducts, for argon gas and diborane gas, respectively. In the present process chamber, mass flow controller 5 can control respective flow rates.

Semiconductor substrate 13 placed on lower electrode 14 in the process chamber is irradiated at the surface with argon plasma for spattering. Flow rate of the argon gas is 50 sccm, pressure within the chamber is 0.7 Pa, helicon power is 1500 W, and bias power is 300 W. The spattering is continued for 70 sec. One second after the spattering is finished, diborane ($B_2H_6$) gas is introduced to the inside of chamber for 70 sec. Flow rate of the diborane ($B_2H_6$) gas is 50 sccm, pressure within the chamber is 1.7 Pa. And then, distribution of boron concentration is measured using a low-energy SIMS in the direction of depth from the surface.

Figure 2:
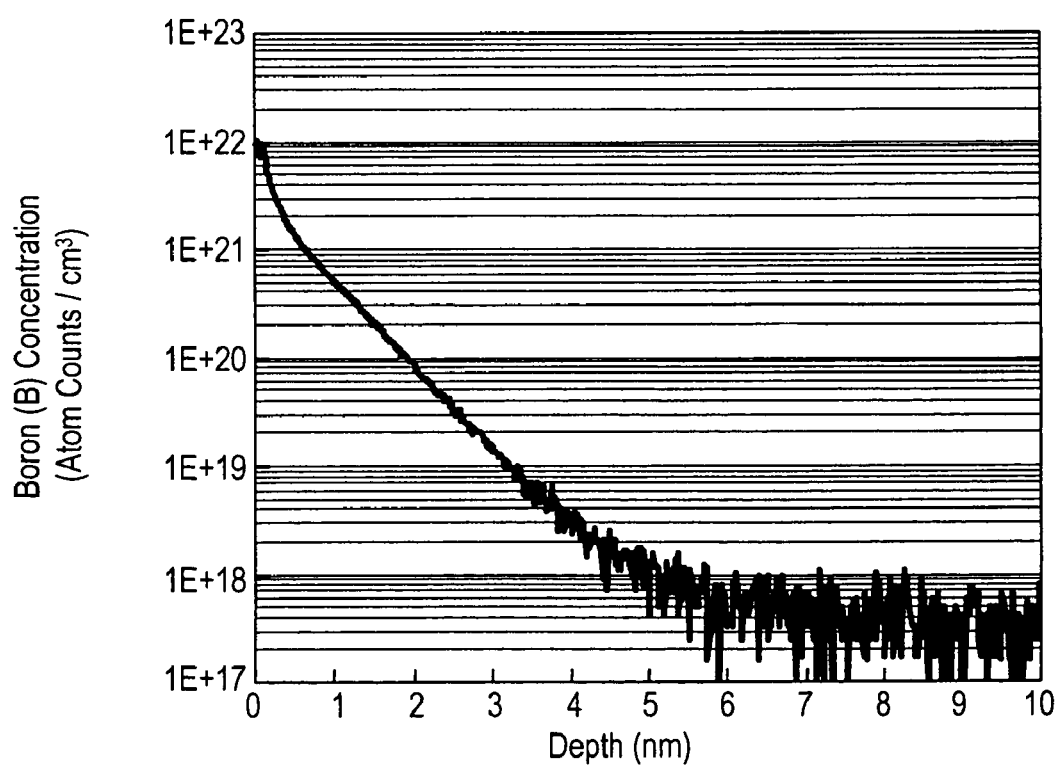
FIG. 2 is a distribution chart showing the boron concentration along the direction of depth from the surface.

FIG. 2 is a boron concentration chart, the distribution is shown in the direction of depth from the surface. In FIG. 2, the lateral axis represents depth from the surface in semiconductor substrate 13 with the unit of nanometer (nm), while the longitudinal axis represents boron (B) concentration with the atom counts per 1 cubic centimeter (atoms/cm$^3$). As seen in FIG. 2, the boron concentration decreases in the order of four digits, within only approximately 5 nm. Defining a place of $1 \times 10^{18}$/cm$^3$ boron (B) concentration as the junction, then the junction locates at 3-4 nm. Thus a junction is observed in such a very shallow profile. Boron (B) can be absorbed stable in the normal room temperature. The amount of boron (B) injection is approximately $1.8 \times 10^{14}$ atoms/cm$^2$. From the above results, it is understood that an impurity layer is formed with a shallower profile, by first irradiating the surface of semiconductor substrate 13 with argon plasma and then introducing diborane ($B_2H_6$) gas to the inside of chamber. Furthermore, since the process used in the present invention is a normal room temperature process, semiconductor substrate 13 does not need to be heated. Thus the present process is simple, and does not require additional steps for forming a transistor.

Exemplary Embodiment B

Figure 3:
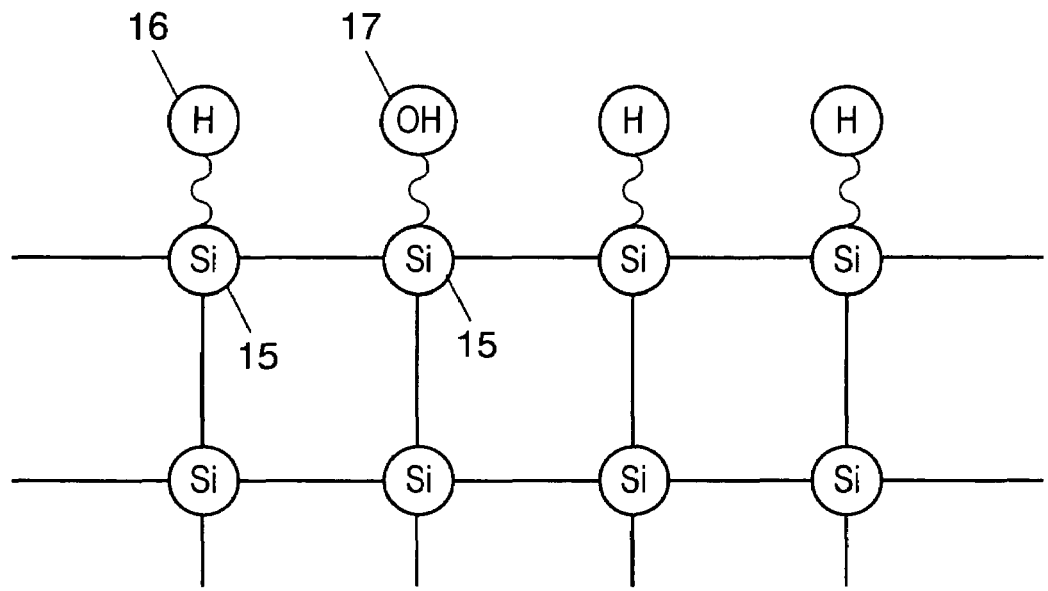
FIG. 3 illustrates the surface conditions of a silicon semiconductor substrate.

FIG. 3 is an illustration used to describe the surface structure of a semiconductor silicon substrate. Covalent binding of silicon (Si) generally ends with hydrogen atom (H) 16 or hydroxyl radical (OH) 17. Terminal silicon atom (Si) 15 couples with three other silicon (Si) atoms and one hydrogen (H) 16 atom or hydroxyl radical (OH) 17.

Irradiating the silicon (Si) with electromagnetic wave seems to bring silicon atom (Si) 15 exposed to the surface to make an activated state.

Figure 4:
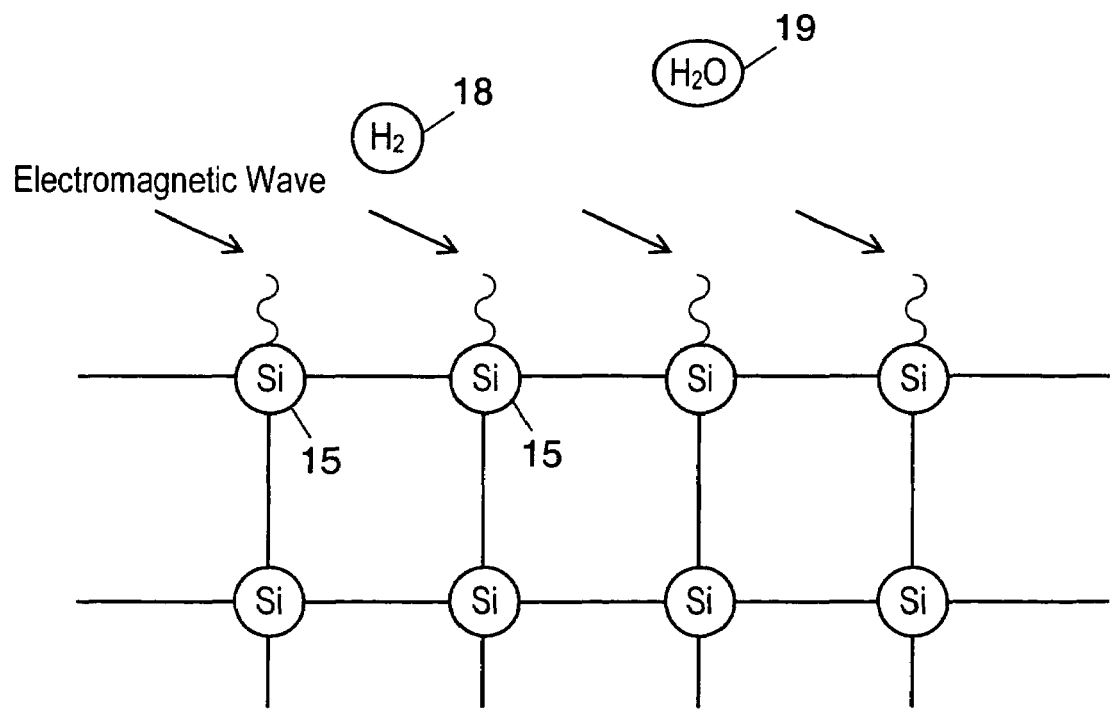
FIG. 4 illustrates the surface conditions where the silicon atom has been activated.

FIG. 4 is an illustration used to describe a state where the silicon atom (Si) at the surface has been activated. Namely, the irradiated electromagnetic wave separates hydrogen atom (H) 16 and hydroxyl radical (OH) 17 from terminal silicon atom (Si) 15, making them into hydrogen molecule ($H_2$) 18 and water ($H_2O$) 19.

Figure 5:
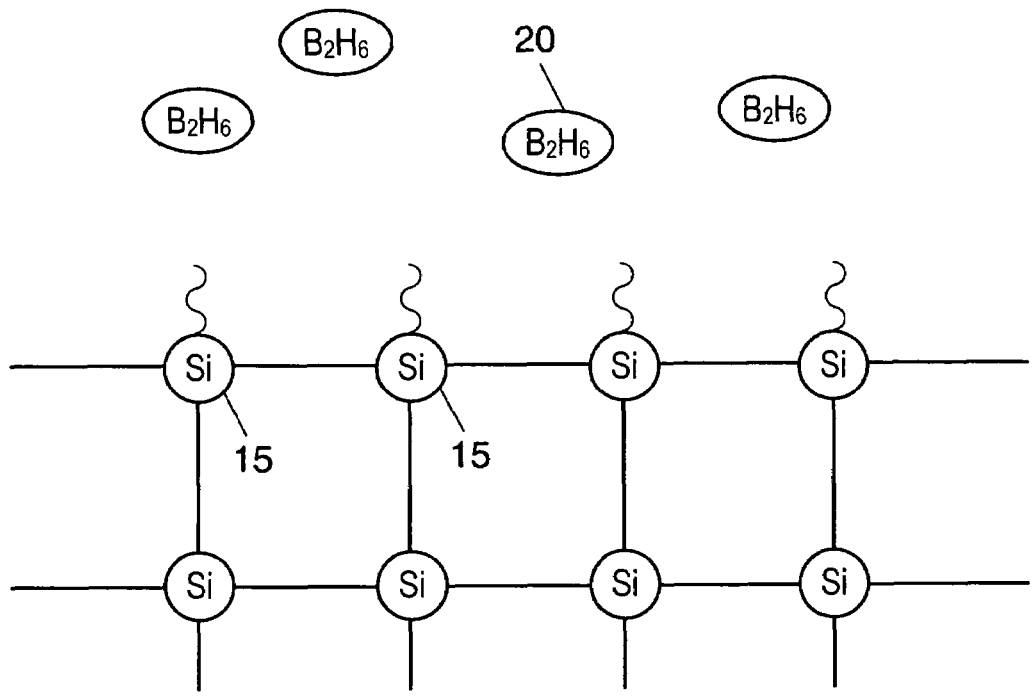
FIG. 5 illustrate a state when diborane gas is making contact.
Figure 6:
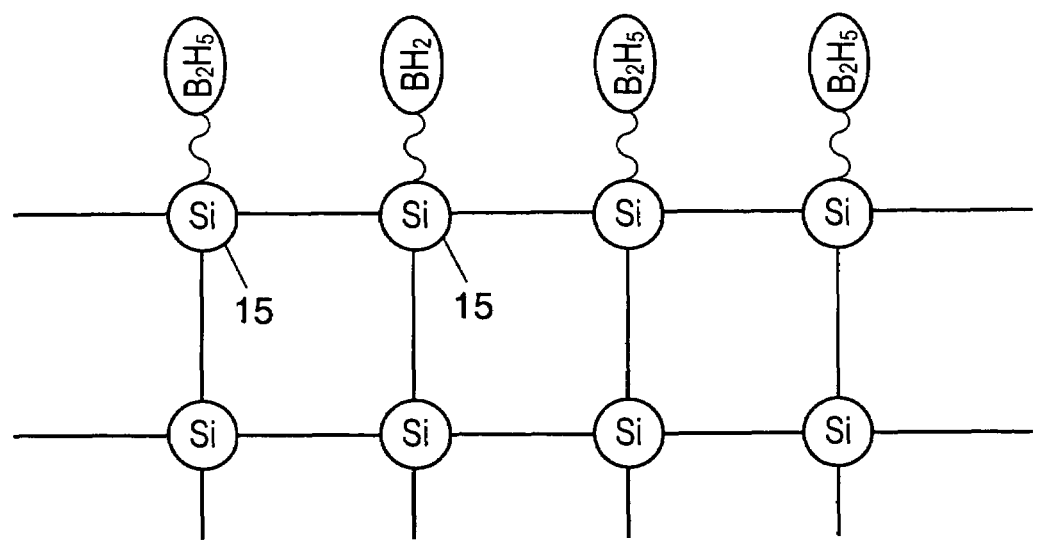
FIG. 6 illustrates the surface conditions of a silicon semiconductor substrate, where a layer containing boron atoms has been formed.

As the next step, diborane ($B_2H_6$) gas, for example, is brought to make contact with the terminal silicon (Si) atom. FIG. 5 illustrates the contact made by diborane ($B_2H_6$). Thus, the contact of e.g. diborane ($B_2H_6$) 20 gas to the terminal silicon (Si) atom produces a layer containing boron atom (B) at the surface of semiconductor substrate. FIG. 6 illustrates the layer containing boron atom (B) formed on the surface. As shown in FIG. 6, a layer containing boron atom (B) can be formed on the surface of silicon (Si) semiconductor substrate, the layer thickness in the present example corresponds to one or two atoms. The above description is based on the use of silicon (Si) for the solid substance, and boron (B) for the impurity. Thus, an impurity layer can be formed at the surface of solid substance for a thickness comparable to one to several atoms; by, first irradiating the surface of solid substance, which surface has been made to be free of the oxidation film and other film, with electromagnetic wave whose energy is stronger than the energy that is binding the hydrogen (H) or hydroxyl radical (OH) at the surface with the atom of solid substance, thereby making the hydrogen (H) or hydroxyl radical (OH) sticking on the surface separated and exposing the atom of solid substance to the surface, and then irradiating a certain desired particle on the surface. In this way, an impurity layer in the unit of an angstrom can be formed.

Some of the particulars of the above-described exemplary embodiment are as follows. Binding energy at a single coupling of silicon (Si) atom and hydrogen (H) atom is 318 kJ/mol. Binding energy at a single coupling of silicon (Si) atom and oxygen (O) atom is 452 kJ/mol. While, binding energy at a single coupling of silicon (Si) atoms is 222 kJ/mol. Since the terminal silicon (Si) atom is connected with three other silicon (Si) atoms, a 666 kJ/mol energy seems to be needed for separating the terminal silicon (Si) atom from a crystalline silicon (Si). By taking advantage of the difference among the binding energies, only the sticking hydrogen (H) or hydroxyl radical (OH) can be separated by irradiating electromagnetic wave whose energy is stronger than the energy that is binding the hydrogen (H) or hydroxyl radical (OH) with the silicon (Si) atom in a single coupling. Namely, silicon (Si) atom can be exposed to the surface to bring the surface to an activated state as shown in FIG. 4, by irradiating electromagnetic wave whose energy corresponds to e.g. 500 kJ/mol. Thereafter, by following the same procedure as described in the above, an impurity layer can be formed in a very shallow profile.

Through the above procedure, semiconductor substrate 13, or the solid substance, becomes those impurity-containing component devices manufactured in accordance with a method of introducing an impurity, or manufactured on an apparatus for introducing an impurity, in the present invention. In other wards, semiconductor substrate 13, or the solid substance, is made into those semiconductor devices, liquid crystal display devices, bio-chips or the like active components, or resistors, coils, capacitors or the like passive components manufactured in accordance with a method of introducing an impurity, or manufactured on an apparatus for introducing an impurity, in the present invention.

As described in the above, the present invention offers a method, as well as an apparatus, for forming an impurity layer in a shallower profile through an easier and simpler procedure. The present invention also offers those component devices whose impurity layer is shallower than the conventionally available impurity layers. Thus the present invention will open the way towards a still-finer processing technology, which would lead to a still-higher integration density, a still-faster signal processing and a less power consumption in the components.

INDUSTRIAL APPLICABILITY

A method of introducing an impurity, or an apparatus for introducing an impurity, in accordance with the present invention makes it possible to form the impurity layers with ease in a shallower profile. Those component devices in the present invention are manufactured by taking advantage of the method of introducing impurity, or the apparatus for introducing impurity, in accordance with the present invention. The impurity layers contained in these component devices have a profile that is shallower than that in the conventional devices. Thus the present invention is expected to open a way towards a still finer micro devices.

The invention claimed is:

1. A method of introducing impurity; wherein, in the course of introducing a material to a solid substance which has an oxidized film or other film sticking on the surface,
   the oxidized film and other film are first removed as the surface treatment to the solid substance with a means for dipping the surface or the solid substance in a reductive liquid,
   a certain desired particle is attached or introduced;
   wherein the reductive liquid is at least one liquid selected from the group consisting of sulfinic acid and adipic acid di-2-ethylhexyl ester.

2. The method of introducing impurity recited in claim 1, wherein
   the means for dipping the surface of solid substance in a reductive liquid rubs the surface of the solid substance mechanically when the solid substance is dipped in the reductive liquid.

3. The method of introducing impurity recited in claim 1, wherein
   the certain desired particle is attached or introduced by bringing a gas containing the certain desired particle to make contact to the surface of solid substance which surface has been made to be free of the oxidized film and other film, thereby the particle is attached or introduced to the surface, or the vicinity, of solid substance.

4. The method of introducing impurity recited in claim 1, wherein
   the certain desired particle is attached or introduced by irradiating the surface of the solid substance, which surface has been made to be free of the oxidized film and other film, with an electromagnetic wave whose energy matches the energy that is binding the hydrogen or hydroxyl radical sticking on the surface with the atom of the solid substance, thereby converting the binding into a non-coupled state, separating the sticking hydrogen or hydroxyl radical, and exposing the atom constituting the solid substance to the surface; and then introducing the certain desired particle for making contact so that the particle is attached or introduced to the surface, or the vicinity, of the solid substance.

5. The method of introducing impurity recited in claim 4, wherein
   the energy of the irradiating electromagnetic wave is greater than 318 kJ/mol and less than 666 kJ/mol.

6. The method of introducing impurity recited in claim 5, wherein
   the energy of the irradiating electromagnetic wave is 425 kJ/mol or higher.

7. The method of introducing impurity recited in claim 1, wherein
   the attaching or introducing of the certain desired particle is conducted in an environment in which the temperature of the solid substance is lower than 600° C.

8. The method of introducing impurity recited in claim 1, wherein
   the certain desired particle is attached or introduced while it is in either one of the states among plasma, gas and ultra low-energy ion.

9. The method of introducing impurity recited in claim 1, wherein
   at least one facility selected from among each of the following respective categories is used; at least one apparatus selected from among the group consisting of an apparatus for irradiating the surface of solid substance with plasma, an apparatus for irradiating the surface of solid substance with gas and an apparatus for dipping the surface of solid substance in a reductive liquid; an apparatus for bringing a gas containing a certain desired particle to the surface of solid substance; and an annealing apparatus for diffusing the certain desired particle attached or introduced therein.

10. The method of introducing impurity recited in claim 9, wherein
    the apparatus for dipping the surface of solid substance in a reductive liquid is provided with a mechanism for rubbing the surface of solid substance mechanically.

11. The method of introducing impurity recited in claim 9, wherein
    at least two items selected from among the following categories are used in a combination mode or as an integration; at least one apparatus selected from among the group consisting of an apparatus for irradiating the surface of solid substance with plasma, an apparatus for irradiating the surface of solid substance with gas and an apparatus for dipping the surface of solid substance in a reductive liquid; an apparatus for bringing a gas containing a certain desired particle to make contact with the surface of solid substance; and an annealing apparatus for diffusing the certain desired particle attached or introduced therein.

12. A method of introducing impurity; wherein, in the course of introducing a material in the phase of ion, plasma, or gas, to a solid substance which has an oxidized film or other film sticking to the surface, the oxidized film and other film are first removed as the surface treatment to solid substance with means for dipping the surface of solid substance in a reductive liquid, and then a certain desired particle is attached or introduced;

wherein the reductive liquid is at least one liquid selected from the group consisting of sulfinic acid and adipic acid di-2-ethylhexyl ester.

* * * * *